United States Patent
Lee et al.

(10) Patent No.: US 7,510,930 B2
(45) Date of Patent: Mar. 31, 2009

(54) METHOD FOR FABRICATING RECESSED GATE MOS TRANSISTOR DEVICE

(75) Inventors: Yu-Pi Lee, Taipei County (TW); Shian-Jyh Lin, Taipei County (TW); Jar-Ming Ho, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 141 days.

(21) Appl. No.: 11/685,756

(22) Filed: Mar. 13, 2007

(65) Prior Publication Data

US 2007/0264772 A1    Nov. 15, 2007

(30) Foreign Application Priority Data

May 12, 2006    (TW) .............................. 95116901 A

(51) Int. Cl.
*H01L 21/8242* (2006.01)
(52) U.S. Cl. ................ 438/243; 438/244; 438/386; 438/424
(58) Field of Classification Search ................ 438/243, 438/244, 246, 386, 387, 389, 424; 257/E21.135, 257/E21.153, E21.546, E21.55
See application file for complete search history.

(56) References Cited

U.S. PATENT DOCUMENTS

| | | | | |
|---|---|---|---|---|
| 7,154,144 B2* | 12/2006 | Kim et al. | ..................... | 257/328 |
| 7,316,952 B2* | 1/2008 | Lee | .............. | 438/243 |
| 2007/0161205 A1* | 7/2007 | Lin et al. | ..................... | 438/424 |
| 2007/0246755 A1* | 10/2007 | Lee et al. | ..................... | 257/288 |

* cited by examiner

*Primary Examiner*—Theresa T Doan
(74) *Attorney, Agent, or Firm*—Winston Hsu

(57) ABSTRACT

A method of fabricating self-aligned gate trench utilizing trench top oxide (TTO) poly spacer is disclosed. A semiconductor substrate having thereon a pad oxide layer and pad nitride layer is provided. A plurality of trench capacitors are embedded in a memory array region of the semiconductor substrate. Each of the trench capacitors has a TTO that extrudes from a main surface of the semiconductor substrate. Poly spacers are formed on two opposite sides of the extruding TTO and are used, after oxidized, as an etching hard mask for etching a recessed gate trench in close proximity to the trench capacitor.

10 Claims, 14 Drawing Sheets

METHOD FOR FABRICATING RECESSED GATE MOS TRANSISTOR DEVICE

BACKGROUND OF THE INVENTION

1. Field of the Invention

The present invention relates generally to a method for fabricating semiconductor devices. More specifically, the present invention relates to a method for making recessed-gate Metal-Oxide-Semiconductor (MOS) transistor device of a trench type Dynamic Random Access Memory (DRAM).

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device. For example, dynamic random access memory devices (DRAMs), which use vertical metal oxide semiconductor field effect transistors (MOSFETs) with deep trench (DT) storage capacitors, have a minimum features size of approximately 70 nm~0.15 μm. Below that size, the internal electric fields exceed the upper limit for storage node leakage, which decreases retention time below an acceptable level. Therefore, there is a need for different methods and/or different structures to further reduce the size of integrated circuit devices.

With the continued reduction in device size, sub-micron scale MOS transistors have to overcome many technical challenges. As the MOS transistors become narrower, that is, their channel length decreases, problems such as junction leakage, source/drain breakdown voltage, and data retention time become more pronounced.

One solution to decrease the physical dimension of ULSI circuits is to form recessed-gate or "trench-type" transistors, which have a gate electrode buried in a groove formed in a semiconductor substrate. This type of transistor reduces short channel effects by effectively lengthening the effective channel length by having the gate extend into the semiconductor substrate.

The recess-gate MOS transistor has a gate insulation layer formed on sidewalls and bottom surface of a recess etched into a substrate, a conductive filling the recess, contrary to a planar gate type transistor having a gate electrode formed on a planar surface of a substrate.

However, the aforesaid recessed-gate technology has some shortcomings. For example, the recess for accommodating the recessed gate of the MOS transistor is etched into a semiconductor wafer by using conventional dry etching methods. It is difficult to control the dry etching and form recesses having the same depth across the wafer. A threshold voltage control problem arises because of recess depth variation.

Furthermore, the aforesaid recessed-gate technology requires at least two steps of polysilicon deposition and a lithography process. The first deposited polysilicon layer is used to form a gate structure of the support circuit area, and a lithography process is required to remove the first deposited polysilicon layer and a silicon oxide layer deposited on the memory array area. Then, a second deposited polysilicon layer is used to form a gate structure of the memory array area. However, when over etching happens in removing the silicon oxide layer and bias or misalignment happens in defining the gate structure, the second deposited polysilicon layer may short with the substrate.

Additionally, the aforesaid recessed-gate technology requires another mask to define the recessed-gate since the large misalignment will reduce the landing area of the source and drain, and increase the bit line contact resistance.

SUMMARY OF THE INVENTION

It is one object of this invention to provide a method for making a recessed gate MOS transistor device of a trench type DRAM in order to solve the above-mentioned problems.

According to the claimed invention, a method for fabricating a recessed gate MOS transistor device, comprising: providing a semiconductor substrate, wherein the semiconductor substrate has a main surface, an array area and a support circuit area; forming a plurality of trench capacitors inlaid in the array area of the semiconductor substrate, wherein each of the trench capacitors is capped by a trench top layer extruding from the main surface; depositing an etching stop layer on the main surface and covering the trench top layer; forming a masking spacer on sidewall of the trench top layer; oxidizing the masking spacer to form an oxide spacer; using the oxide spacer as an etching hard mask, dry etching the etching stop layer and the semiconductor substrate, thereby forming a self-aligned gate trench; forming a gate dielectric layer on side and bottom of the gate trench; and forming a gate material layer on the gate dielectric layer to fill the gate trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
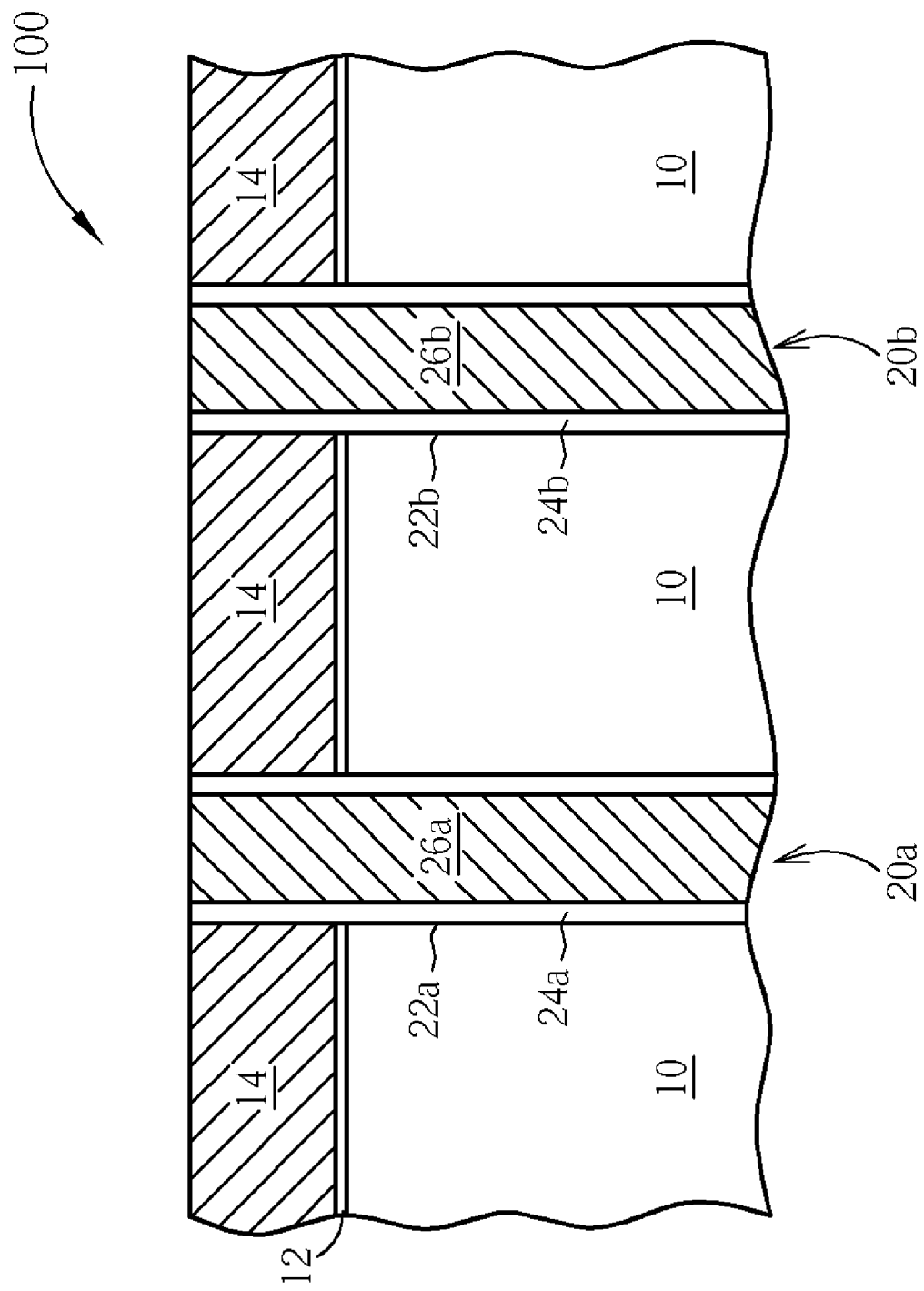
FIGS. 1-14 are schematic, cross-sectional diagrams illustrating a self-aligned method of fabricating a recessed-gate MOS transistor device of a trench type DRAM in accordance with one preferred embodiment of this invention.

Please refer to FIGS. 1-14. FIGS. 1-14 are schematic, cross-sectional diagrams illustrating a self-aligned method of fabricating a recessed-gate Metal-Oxide-Semiconductor (MOS) transistor device of a trench type Dynamic Random Access Memory (DRAM). As shown in FIG. 1, a semiconductor substrate 10 such as a silicon substrate, silicon epitaxial substrate or Silicon-On-Insulator (SOI) substrate is provided. A pad oxide layer 12 is then deposited on the semiconductor substrate 10. A pad nitride layer 14 is then deposited on the pad oxide layer 12.

The pad oxide layer 12 may be formed by thermal oxidation methods or using chemical vapor deposition (CVD) methods. Typically, the pad oxide layer 12 has a thickness of about 10-500 angstroms. The pad nitride layer 14 may be formed by low-pressure CVD (LPCVD) or using any other suitable CVD methods. Preferably, the pad nitride layer 14 has a thickness of about 500-5000 angstroms.

Deep trench capacitors 20a and 20b are formed in deep trench 22a and deep trench 22b, respectively, within a memory array area 100 of the semiconductor substrate 10.

The deep trench capacitor 20a comprises a sidewall oxide dielectric layer 24a and a doped polysilicon 26a. The deep trench capacitor 20b comprises a sidewall oxide dielectric layer 24b and a doped polysilicon 26b. The doped polysilicon 26a and the doped polysilicon 26b function as one capacitor electrode of the deep trench capacitors 20a and 20b, respectively.

For the sake of simplicity, only the upper portions of the deep trench capacitors 20a and 20b are shown in figures. It is understood that the deep trench capacitors 20a and 20b further comprises a buried plate acting as the other capacitor electrode, which is not shown.

Figure 2:
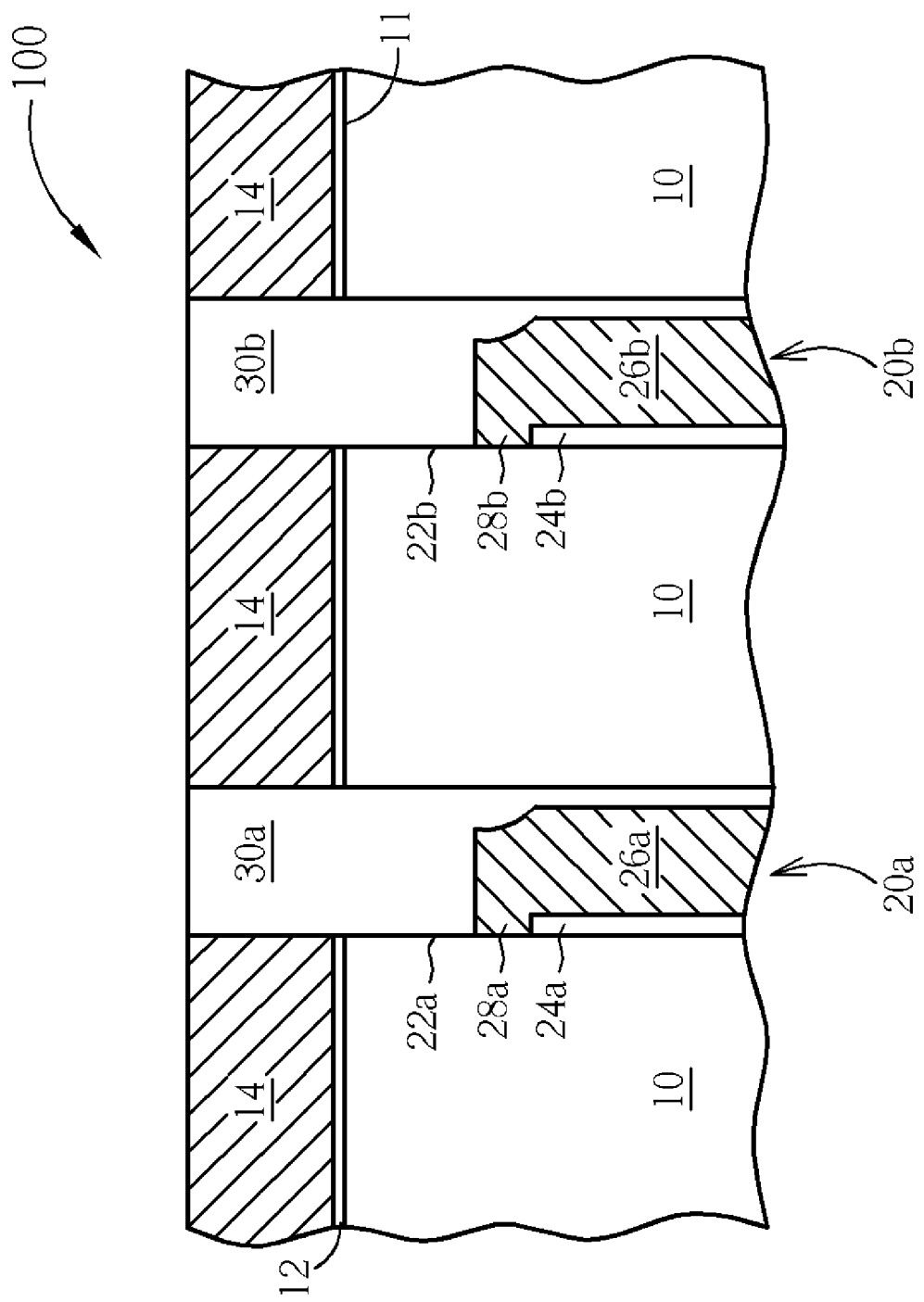

As shown in FIG. 2, a so-called Single-Sided Buried Strap (SSBS) process is carried out to form single-sided buried strap 28a and 28b on the deep trench capacitors 20a and 20b respectively. Subsequently, a Trench Top Oxide (TTO) layers 30a and 30b are formed to cap the single-sided buried strap 28a and 28b respectively. The TTO layers 30a and 30b extrude from a main surface 11 of the semiconductor substrate 10.

The aforesaid SSBS process generally comprises the steps of etching back the sidewall oxide dielectric layer and the doped polysilicon (or so-called Poly-2) 26a and 26b to a first depth; refilling the recess with another layer of polysilicon (or so-called Poly-3); etching back the Poly-3 to a second depth; forming an asymmetric spacer on interior sidewall of the recess; etching away the Poly-3 and Poly-2 that are not covered by the asymmetric spacer; filling the recess with TTO insulation layer; and chemical mechanical polishing the TTO insulation layer.

Figure 3:
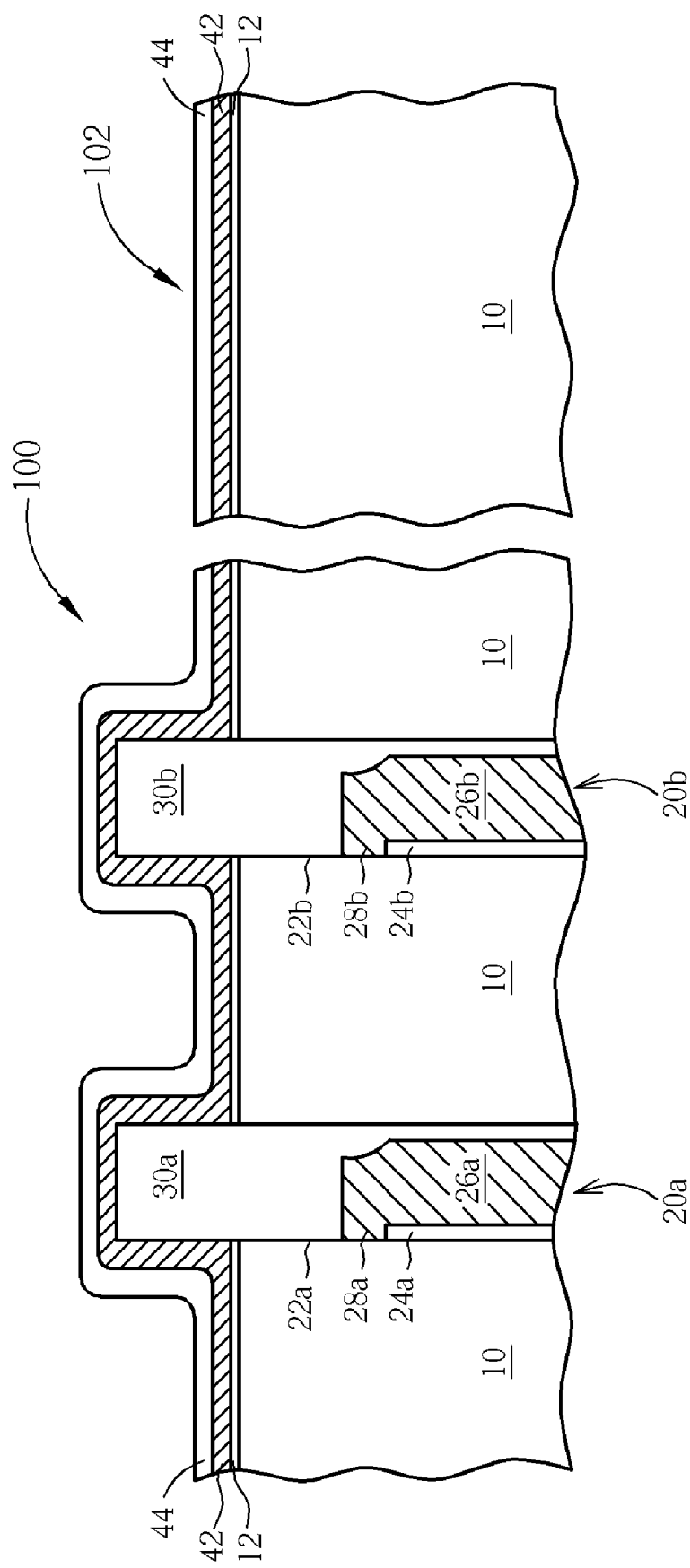

As shown in FIG. 3, after the formation of the SSBS 28a and 28b, the pad nitride layer 14 is stripped off by using methods known in the art, for example, wet etching solution such as heated phosphorus acid dipping, but not limited thereto.

A Chemical Vapor Deposition (CVD) process such as a Low-Pressure CVD (LPCVD) or Plasma-Enhanced CVD (PECVD) is carried out deposit a conformal etching stop layer 42 on the semiconductor substrate 10 within the memory array area 100 and support circuit area 102. According to the preferred embodiment of this invention, the etching stop layer 42 comprises silicon nitride wherein the etching stop layer has thickness of about 50-500 angstroms, preferably 100-300 angstroms.

Another CVD process such as a LPCVD or PECVD is carried out to deposit a masking layer 44 on the etching stop layer 42. According to the preferred embodiment of this invention, the masking layer 44 has thickness of about 50-500 angstroms, preferably 100-400 angstroms. Please note that the amorphous silicon layer 44 can be replaced with a polysilicon layer or amorphous silicon layer.

Figure 4:
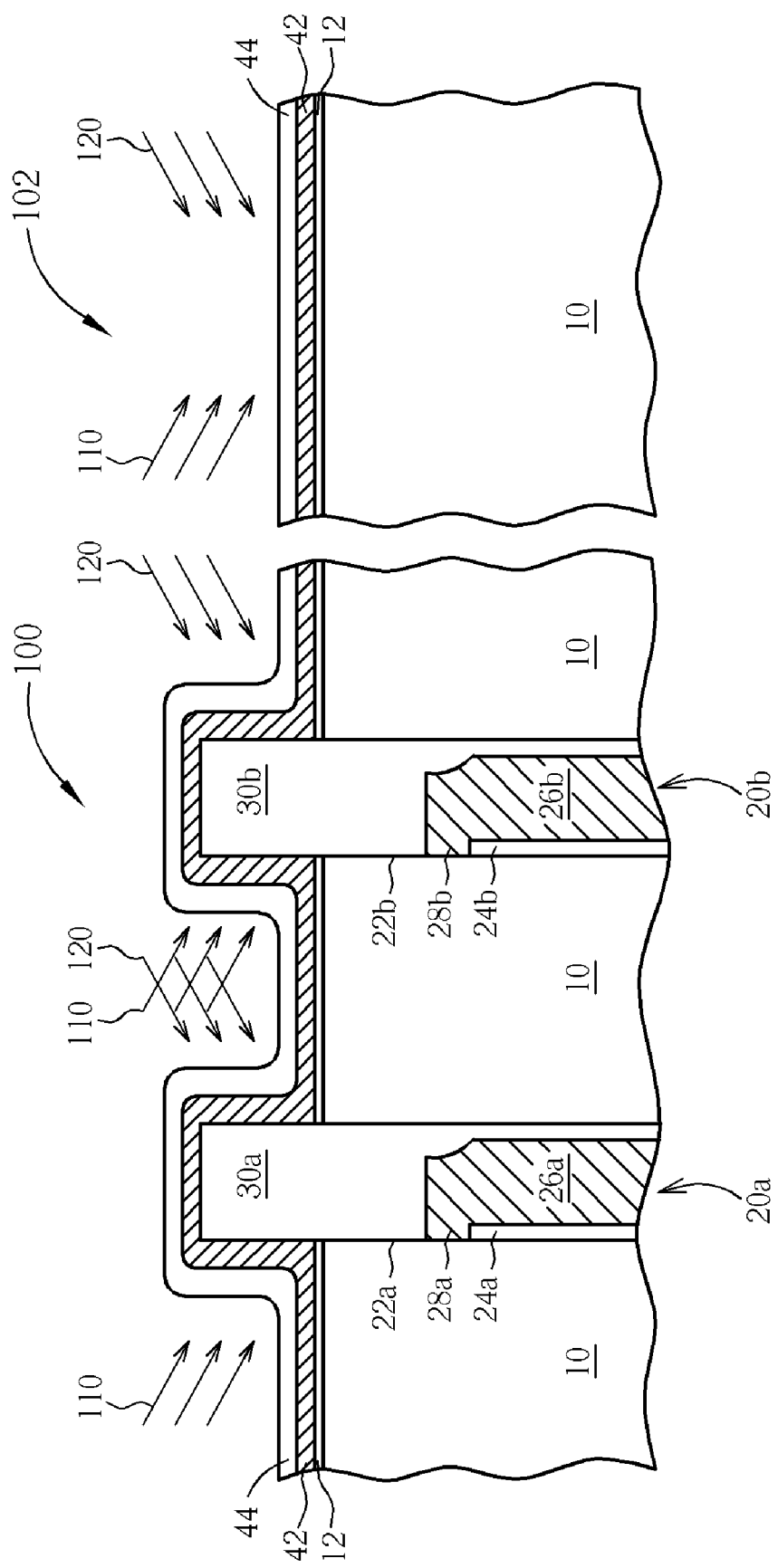

As shown in FIG. 4, two tilt-angle ion implantation processes 110 and 120 with opposite ion implantation directions are performed to implant dopants such as $BF_2$ into the masking spacer 44a on the TTO layers 30a and 30b.

Figure 5:
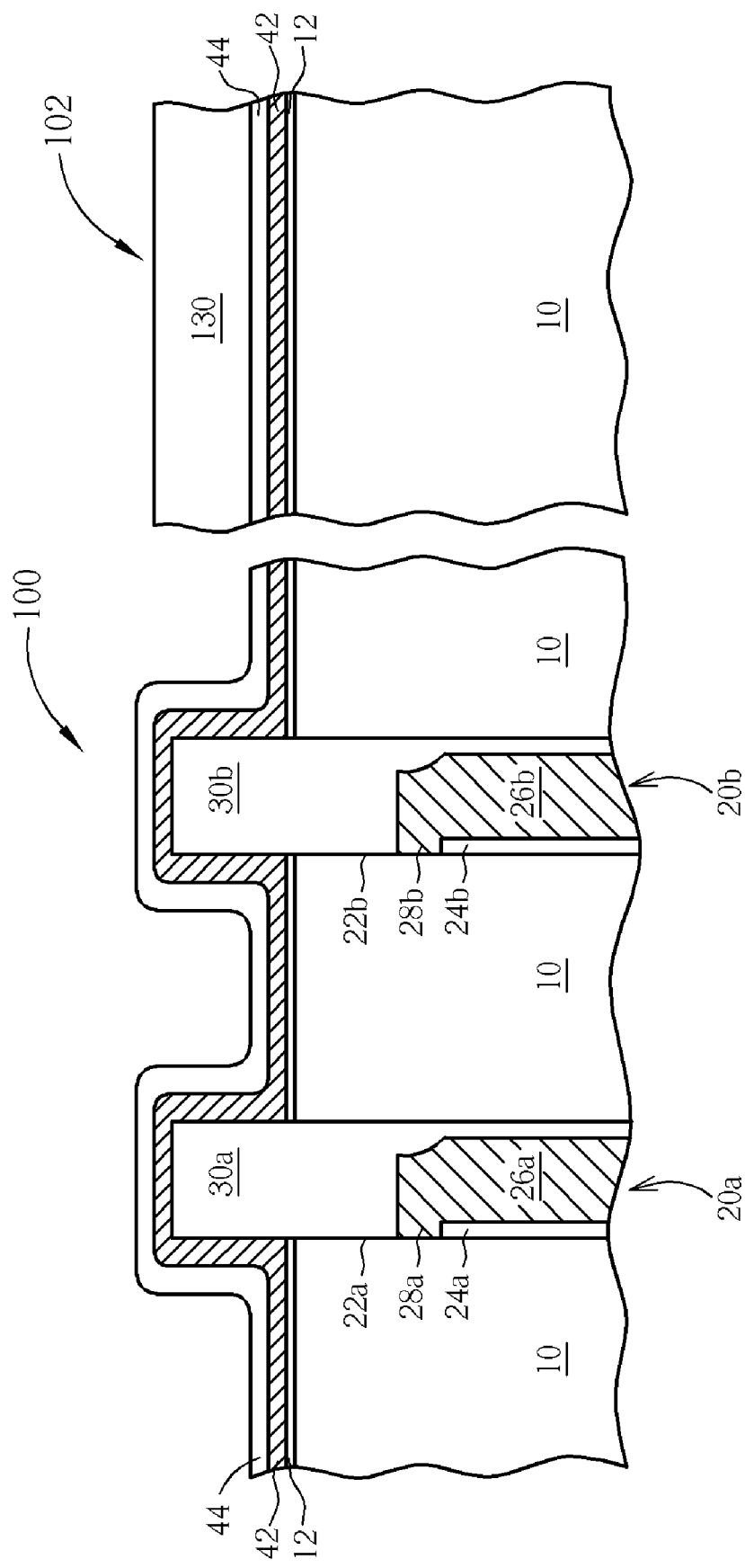

As shown in FIG. 5, a photoresist layer 130 is coated. A lithographic process is carried out to open the memory array area 100 while masking the support circuit area 102.

Figure 6:
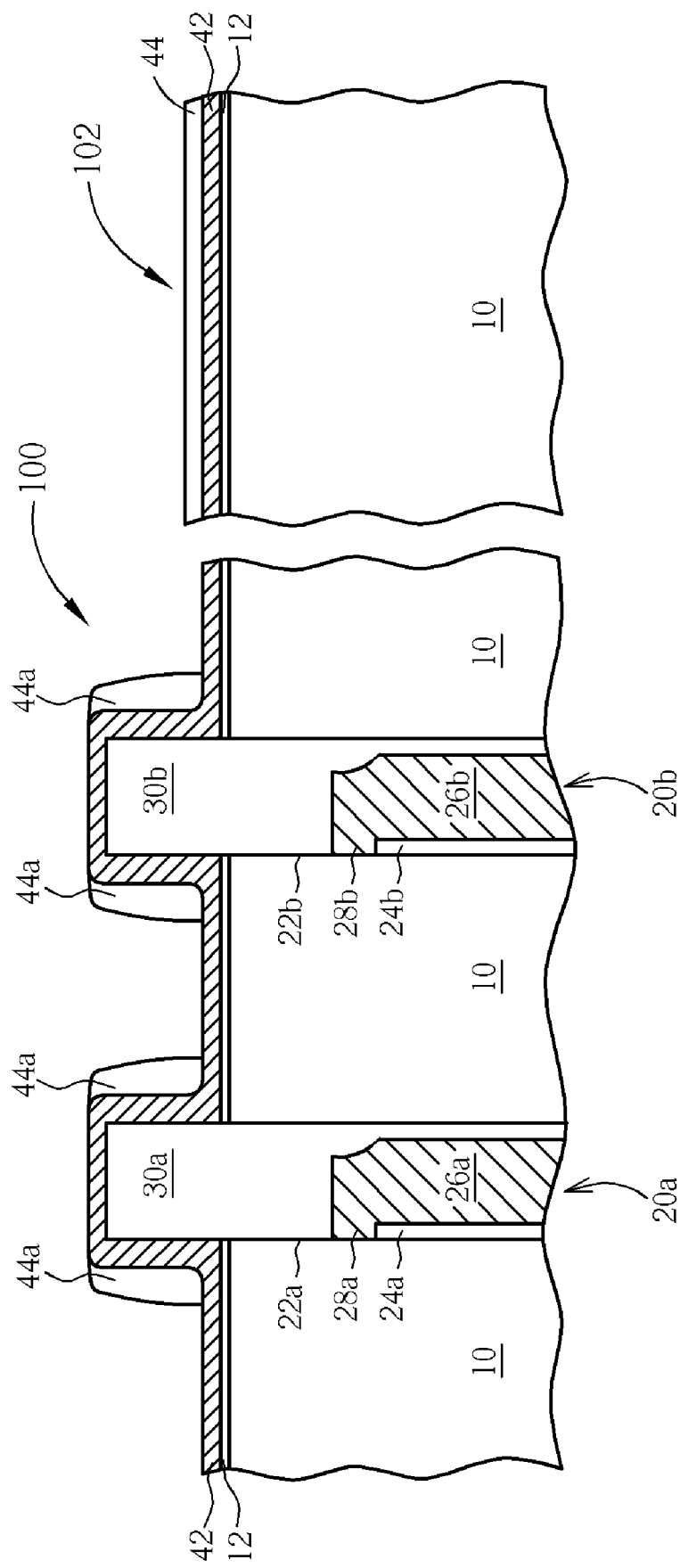

As shown in FIG. 6, an anisotropic dry etching process is then carried out to etch the masking layer 44, thereby forming a masking spacer 44a encircling sidewall of the extruding TTO layers 30a and 30b. After forming the masking spacer 44a, the photoresist layer 130 is removed to expose the masking layer 44 of the support circuit area 102. The masking spacer 44a is then selectively etched by $NH_4OH$ solution, and the masking spacer 44a that is not doped with BF2 is removed.

Figure 7:
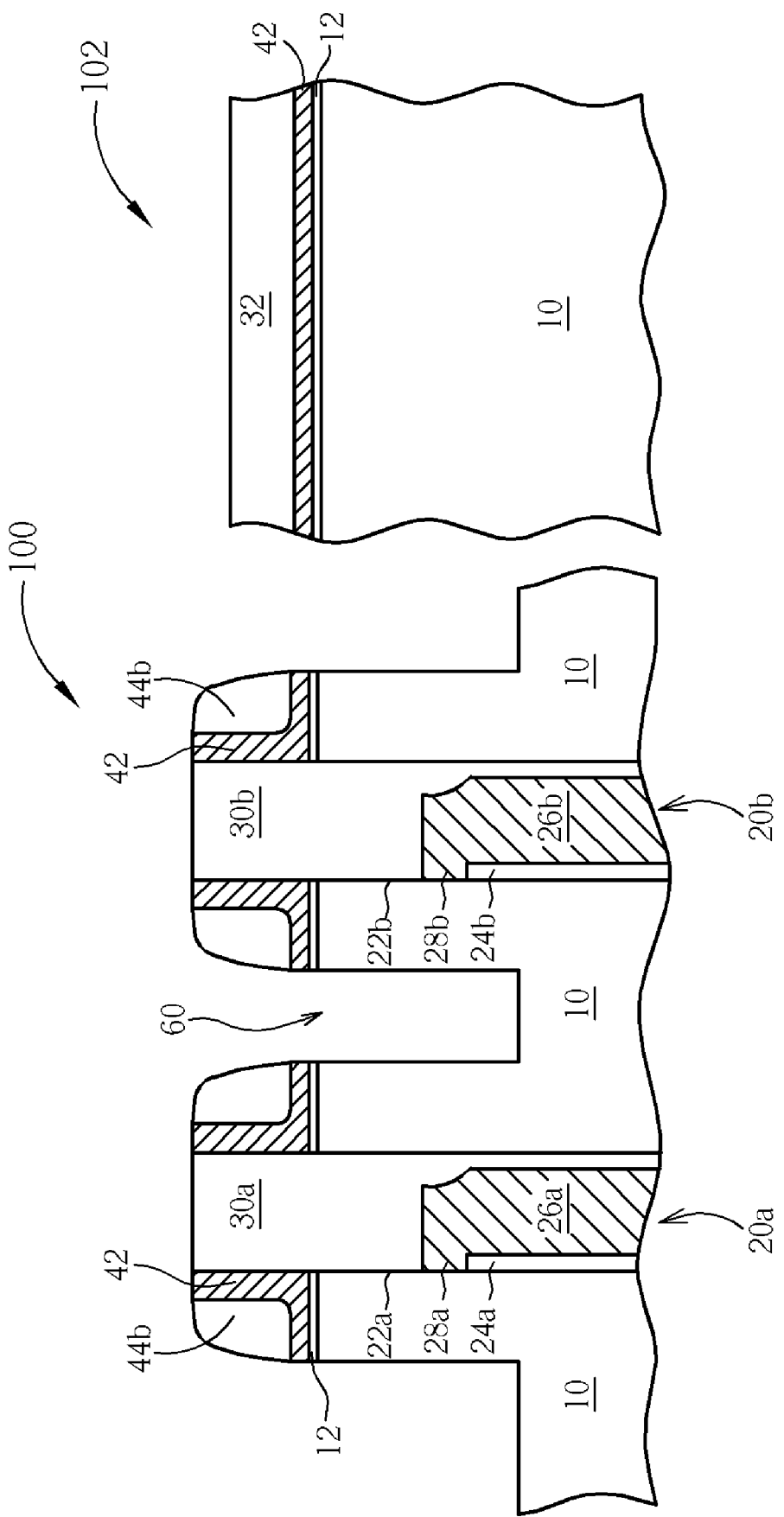

As shown in FIG. 7, an oxidation process is performed to oxidize the masking spacer 44a, thereby forming a silicon oxide spacer 44b and a silicon oxide layer 32. An anisotropic dry etching process is then carried out. The silicon oxide spacer 44b and the TTO layers 30a and 30b together are used as an etching hard mask to form a self-aligned gate trench 60 in the semiconductor substrate 10. At this phase, the pad oxide layer 12, the silicon nitride liner 42, and the silicon oxide layer 32 remain in the support circuit area 102.

Figure 8:
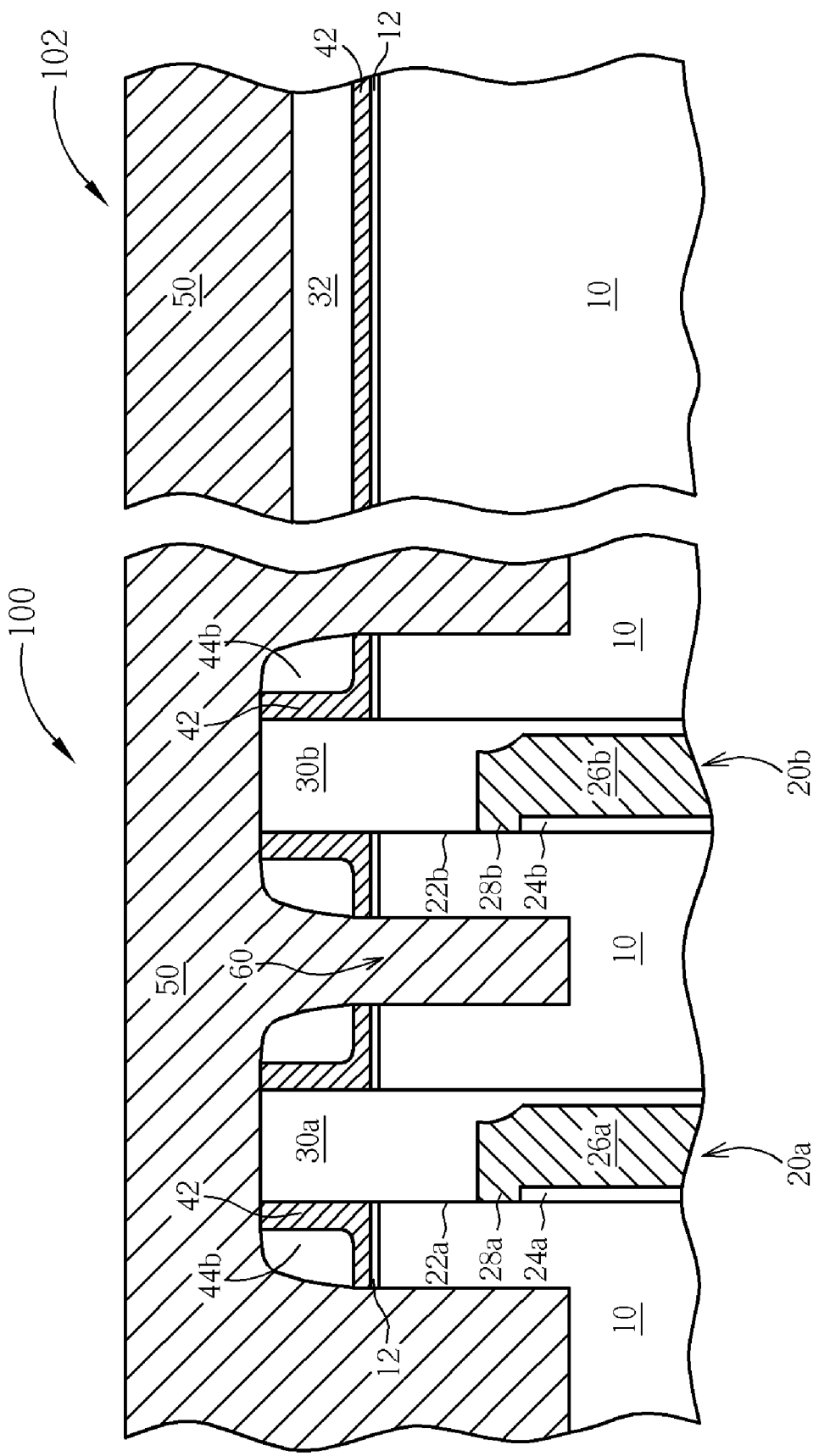

As shown in FIG. 8, a CVD process such as LPCVD or PECVD process is performed to deposit a silicon nitride layer 50 over the semiconductor substrate 10 in the memory array area 100 and in the support circuit area 102. The silicon nitride layer 50 fills the gate trench 60. Furthermore, a silicon nitride liner (not shown) may be deposited first before the silicon nitride layer 50 is deposited.

Figure 9:
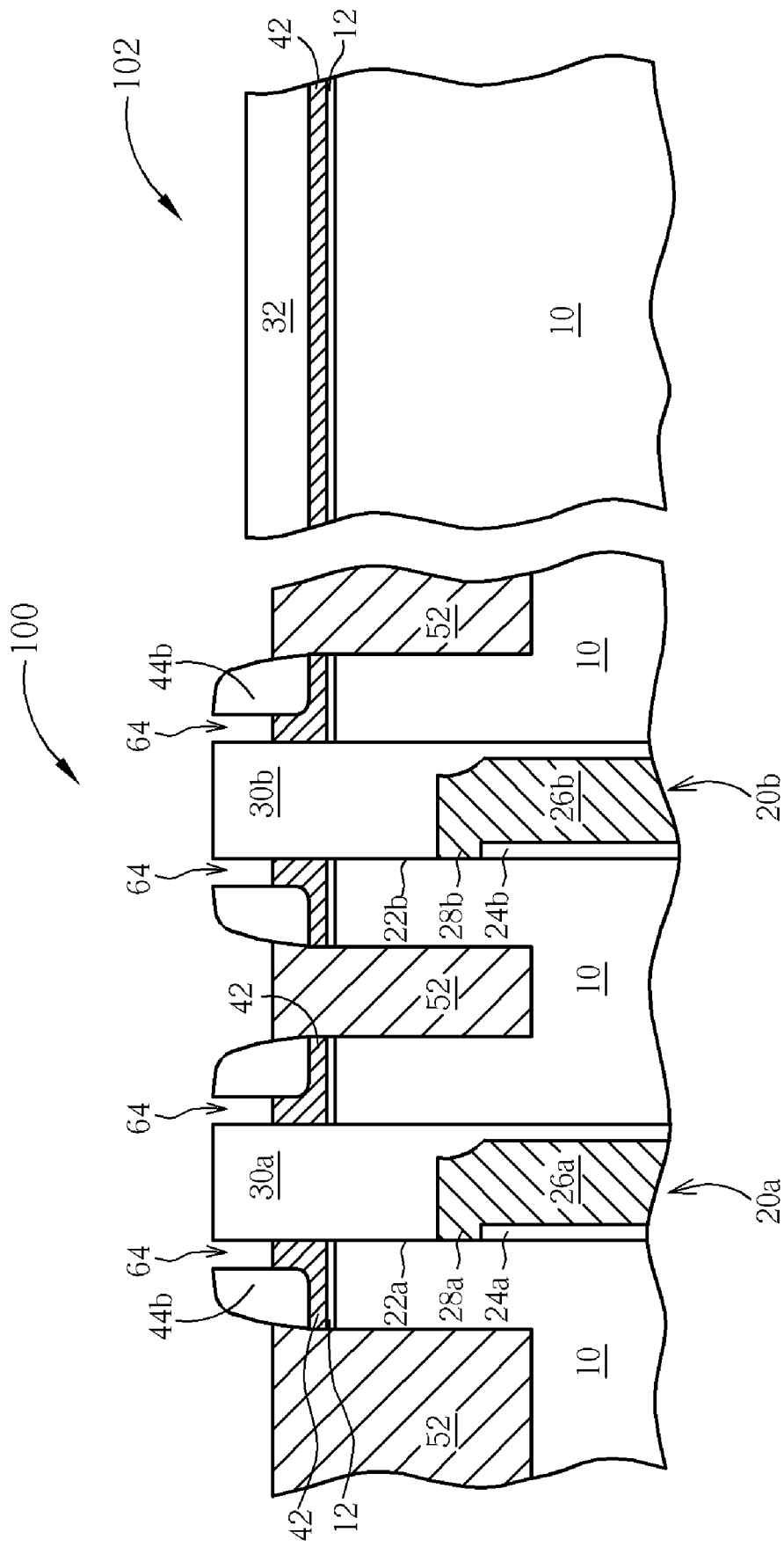

As shown in FIG. 9, an etching process such as a wet etching process or an anisotropic dry etching process is carried out to etch the silicon nitride layer 50 with a predetermined thickness and a portion of the etching stop layer 42 between the silicon oxide spacer 44b and the trench top layer, thereby exposing the top surfaces of the TTO layers 30a and 30b. In the meantime, a crevice 64 is formed between the silicon oxide spacer 44b and the trench top layer. The remnant silicon nitride layer 50 remains in the gate trench 60 as a dummy silicon nitride gate 52. In the support circuit area 102, the silicon nitride layer 50 deposited on the silicon oxide layer 32 is removed to expose the silicon oxide layer 32.

Figure 10:
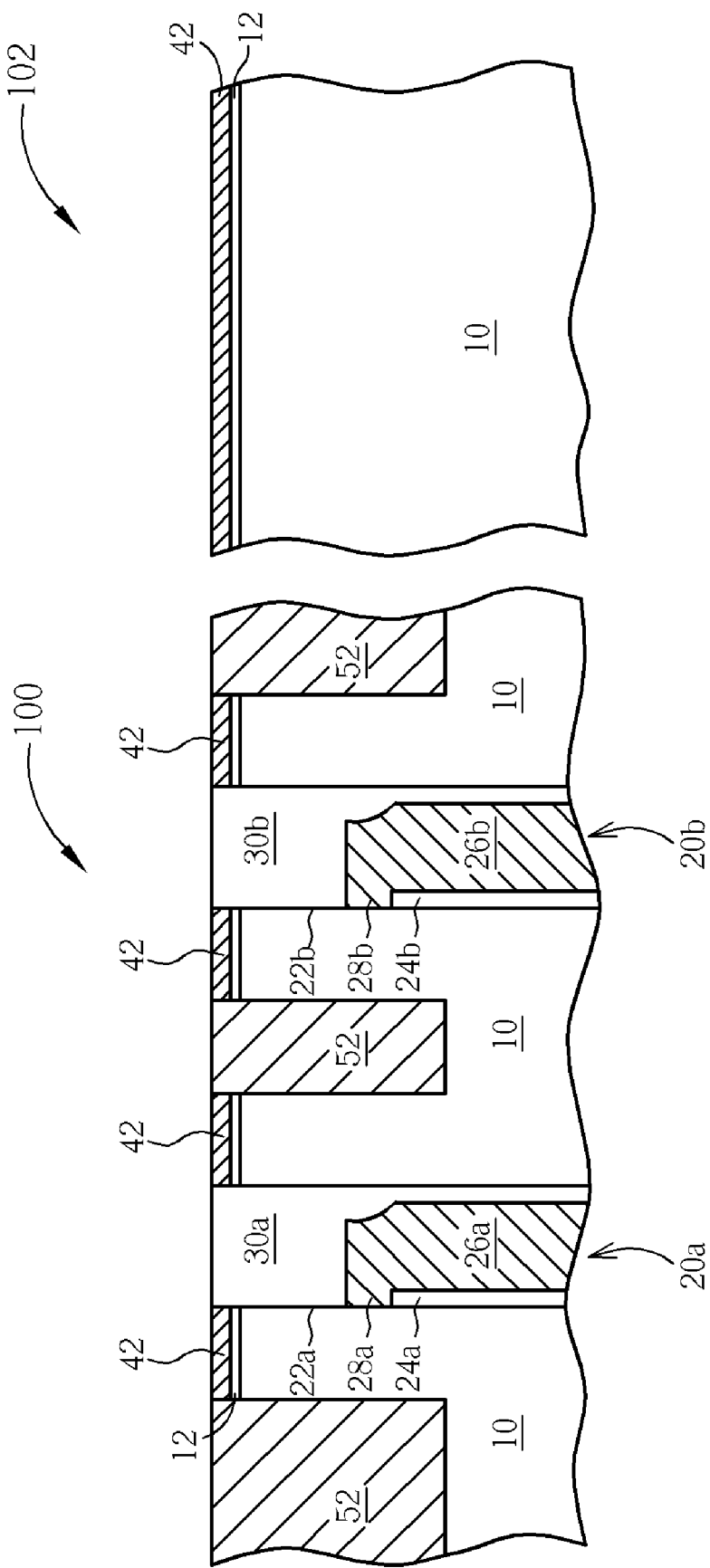

As shown in FIG. 10, a Chemical Mechanical Polishing (CMP) process is performed. Using the remnant silicon nitride liner 42 and the dummy silicon nitride gate 52 as polishing stop layers, the silicon oxide spacer 44b and a part of the TTO of the memory array area 100, and the silicon oxide layer 32 of the support circuit area 102 are polished and a planarized surface of the semiconductor substrate 10 is provided. The silicon nitride liner 42 of the support circuit area 102 is exposed.

Figure 11:
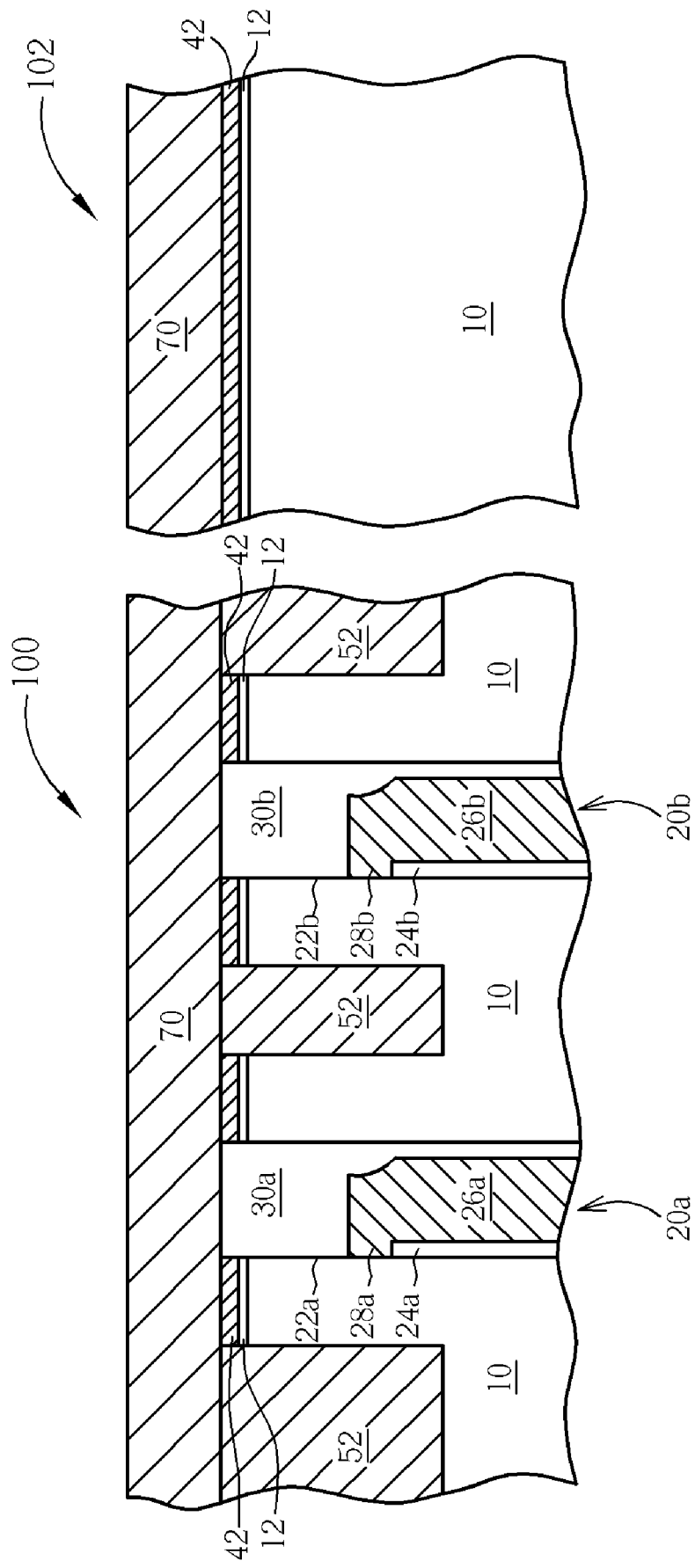

As shown in FIG. 11, a CVD process such as LPCVD or PECVD process is performed to deposit a silicon nitride layer 70 over the memory array area 100 and in the support circuit area 102.

Figure 12:
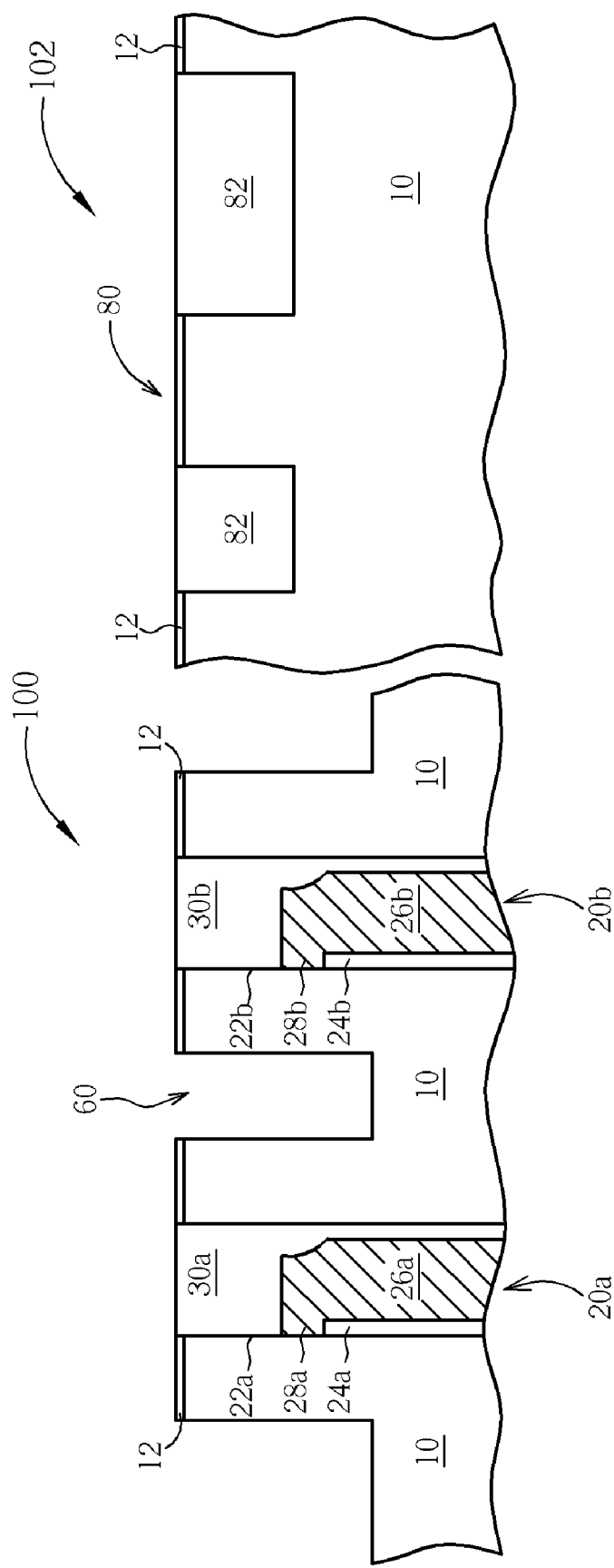

Next, as shown in FIG. 12, the following steps are performed to define the active areas 80 and shallow trench isolation areas 82 within the support circuit area 102: (1) deposition of a boron doped silicate glass (BSG) layer; (2) deposition of a polysilicon layer; (3) lithographic and etching process for defining the active areas in the support circuit region; (4) oxidation for oxidizing the active areas in the support circuit region; (5) trench filling for the shallow trench isolation and chemical mechanical polishing, but the steps are not limited.

The remnant silicon nitride layer 42, 70, and the dummy silicon nitride gate 52 on the semiconductor substrate 10 are removed at the same time to empty the gate trench 60 in the memory array area 100, and expose the pad oxide layer 12 in the support circuit area 102 as shown in FIG. 12.

Figure 13:
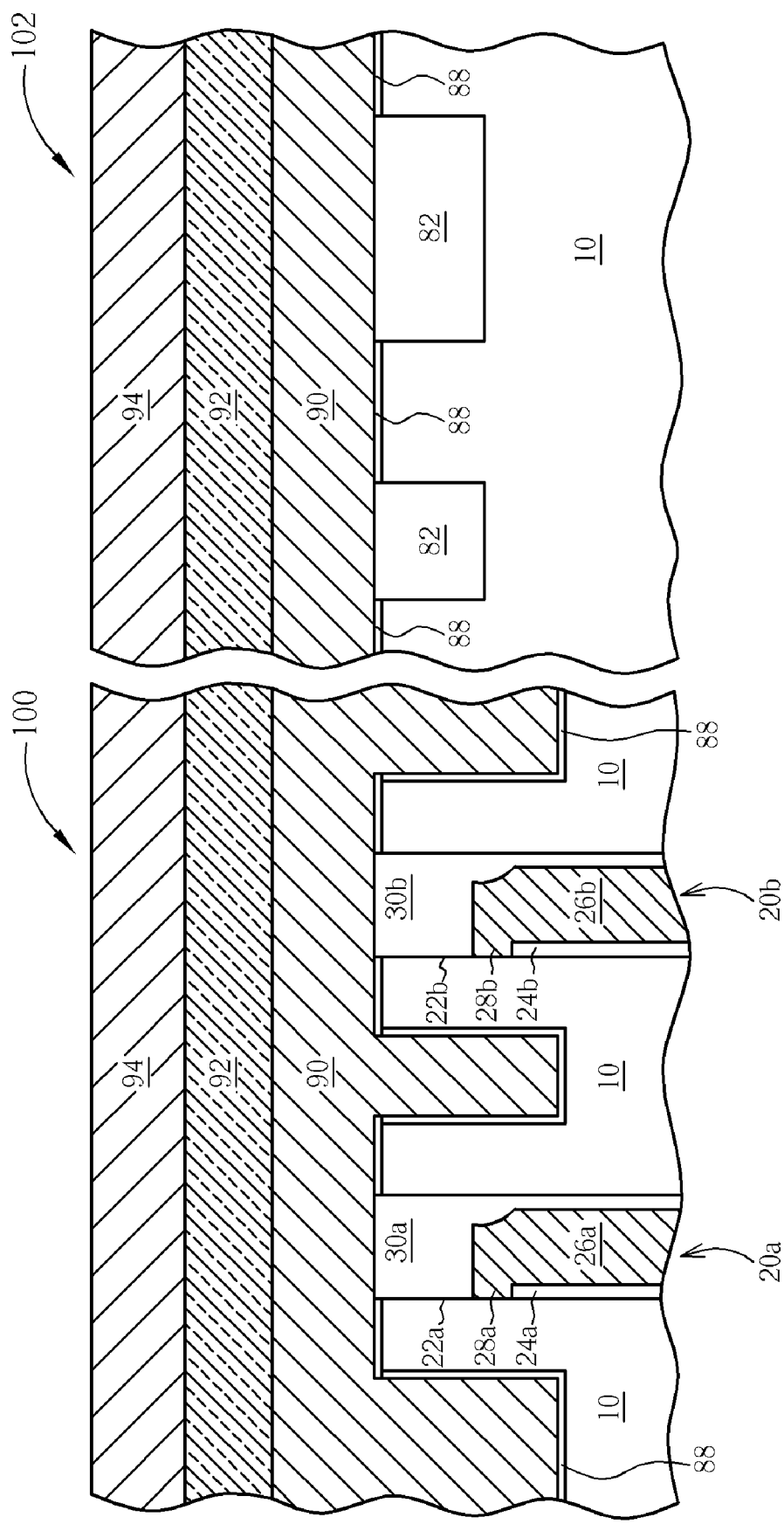

As shown in FIG. 13, an etching process such as a wet etching process is performed to remove the pad oxide layer 12 in the memory array area 100 and the pad oxide layer 12 to expose the semiconductor substrate 10. Then, a thermal oxidization process such as an In-Situ team Growth (ISSG) process is performed to form a gate dielectric layer 88 on the semiconductor substrate 10 exposed in the memory array area 100 and support circuit area 102.

Then, a CVD process is performed to deposit a doped polysilicon layer 90 over the semiconductor substrate 10, and the gate trench 60 is filled with doped polysilicon layer 90. A silicide metal layer 92 such as WSi and a silicon nitride top layer 94 are deposited on the doped polysilicon layer 90 in sequence.

Figure 14:
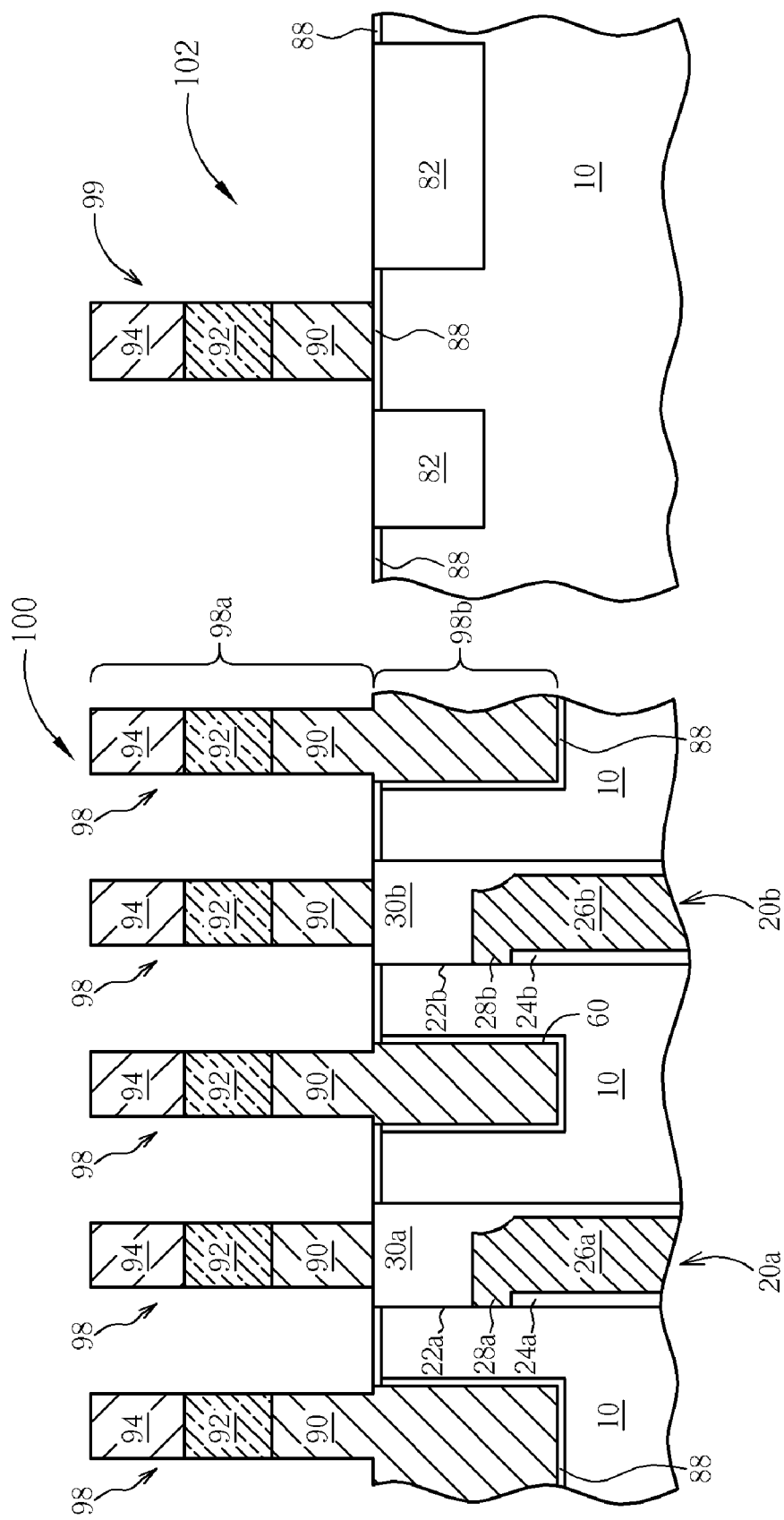

As shown in FIG. 14, a lithography process and a etching process are performed by using the same mask to define a gate pattern 98 in the memory array area 100, including a gate conductor 98a, a recessed gate 98b embedded in the gate trench 60, and a gate structure 99 formed in the support circuit area 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a recessed gate MOS transistor device, comprising:

providing a semiconductor substrate, wherein the semiconductor substrate has a main surface, an array area and a support circuit area;

forming a plurality of trench capacitors inlaid in the array area of the semiconductor substrate, wherein each of the trench capacitors is capped by a trench top layer extruding from the main surface;

depositing an etching stop layer on the main surface and covering the trench top layer;

forming a masking spacer on sidewall of the trench top layer;

oxidizing the masking spacer to form an oxide spacer;

using the oxide spacer as an etching hard mask, dry etching the etching stop layer and the semiconductor substrate, thereby forming a self-aligned gate trench;

forming a gate dielectric layer on side and bottom of the gate trench; and forming a gate material layer on the gate dielectric layer to fill the gate trench.

2. The method of claim 1 wherein the semiconductor substrate has a pad oxide layer and a pad silicon nitride layer are formed on the main surface.

3. The method of claim 1 wherein the top surface of the trench top layer is approximately coplanar with top surface of the pad silicon nitride layer.

4. The method of claim 1 wherein the etching stop layer comprises silicon nitride.

5. The method of claim 1 wherein the etching stop layer has a thickness of 50-500 angstroms.

6. The method of claim 1 wherein the masking layer comprises polysilicon or amorphous silicon layer.

7. The method of claim 1 wherein the trench top layer comprises silicon oxide.

8. The method of claim 1 wherein before forming a gate dielectric layer, the method further comprises steps as follows:

depositing a first silicon nitride layer to fill the gate trench;

etching back the first silicon nitride layer;

performing a chemical mechanical polishing process to polish the oxide spacer and a part of the trench top layer;

removing the silicon nitride layer and the etching stop layer.

9. The method of claim 8 wherein before removing the silicon nitride layer and the etching stop layer, the method further comprises steps as follows:

depositing a second silicon nitride layer over the semiconductor substrate; and performing an active area defining process for the support circuit area.

10. The method of claim 1 wherein the step of forming the masking spacer on sidewall of the trench top layer comprises steps as follows:

depositing a masking layer on the etching stop layer;

performing a tilt-angle ion implantation process to implant dopants into the masking spacer on two corresponding sides of the trench top layer;

performing a selectively etched, and the masking spacer that is not doped is removed.

* * * * *